(12) United States Patent
Kim et al.

(10) Patent No.: US 10,388,586 B2
(45) Date of Patent: Aug. 20, 2019

(54) SEMICONDUCTOR PACKAGE DEVICE AND METHOD OF MANUFACTURING THE SAME

(71) Applicant: Advanced Semiconductor Engineering Korea, Inc., Paju-si, Gyeonggi-do (KR)

(72) Inventors: Seokbong Kim, Paju-si (KR); Sunju Park, Paju-si (KR); Hyoungjoon Jin, Paju-si (KR)

(73) Assignee: ADVANCED SEMICONDUCTOR ENGINEERING, KOREA, INC., Paju-si, Gyeonggi-Do (KR)

( * ) Notice: Subject to any disclaimer, the term of this patent is extended or adjusted under 35 U.S.C. 154(b) by 0 days.

(21) Appl. No.: 15/680,669

(22) Filed: Aug. 18, 2017

(65) Prior Publication Data

US 2019/0057943 A1 Feb. 21, 2019

(51) Int. Cl.
*H01L 23/373* (2006.01)
*H01L 23/552* (2006.01)
*H01L 23/28* (2006.01)
*H01L 23/31* (2006.01)

(52) U.S. Cl.
CPC .......... *H01L 23/3736* (2013.01); *H01L 23/28* (2013.01); *H01L 23/315* (2013.01); *H01L 23/3121* (2013.01); *H01L 23/552* (2013.01); *H01L 2223/6677* (2013.01); *H01L 2224/16225* (2013.01); *H01L 2224/48091* (2013.01); *H01L 2224/48227* (2013.01); *H01L 2924/1815* (2013.01); *H01L 2924/19105* (2013.01)

(58) Field of Classification Search
CPC .................................................... H01L 23/3736
USPC .......... 438/121–127; 257/660–661, 706, 796
See application file for complete search history.

(56) References Cited

U.S. PATENT DOCUMENTS 6,686,649 B1  2/2004  Mathews et al.
7,049,682 B1  5/2006  Mathews et al.
2017/0358540 A1*  12/2017  Min ...................... H01L 23/552
                                                              257/661

* cited by examiner

*Primary Examiner* — Calvin Lee
(74) *Attorney, Agent, or Firm* — Foley & Lardner LLP; Cliff Z. Liu

(57) ABSTRACT

A semiconductor package device comprises a substrate, a die, an encapsulant and an antenna layer. The substrate has a top surface and a bottom surface opposite to the top surface. The die is disposed on the top surface of the substrate. The encapsulant is disposed on the top surface of the substrate and surrounds the die. The encapsulant has a top surface and defines a recess on the top surface of the encapsulant. The antenna layer is disposed on the top surface of the encapsulant and extends within the recess on the top surface of the encapsulant.

21 Claims, 14 Drawing Sheets

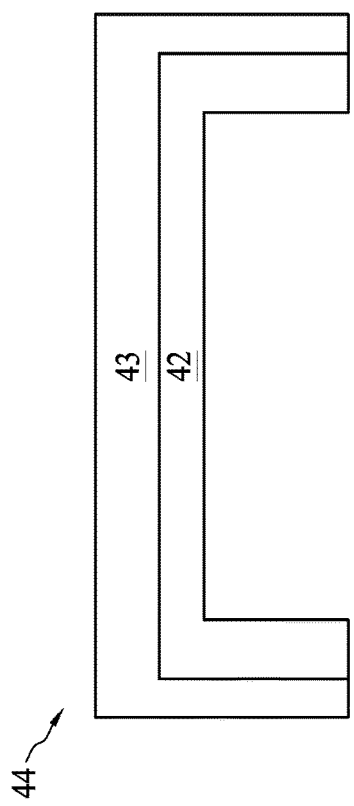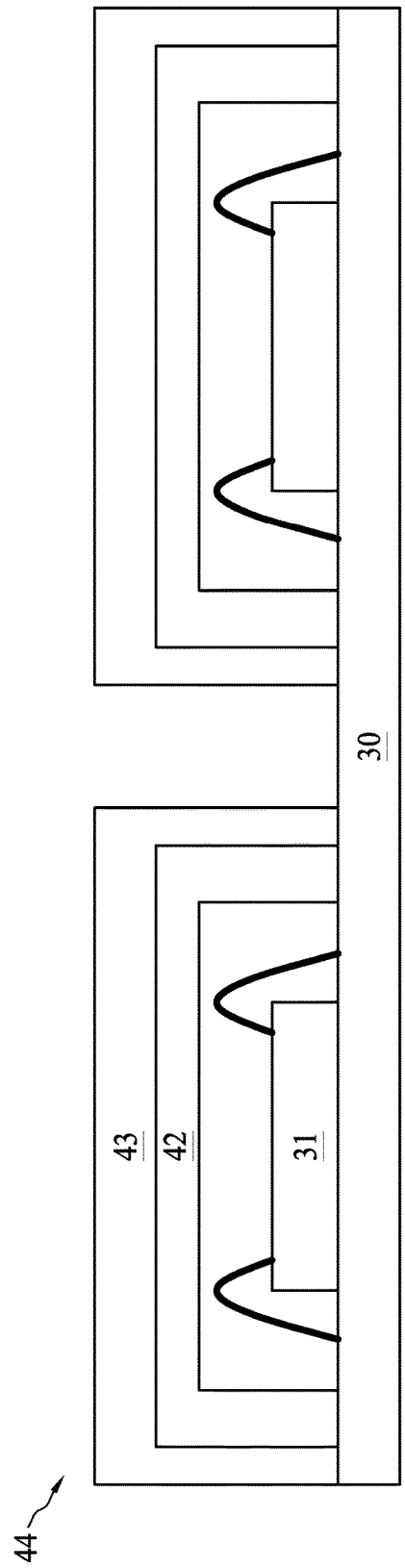
FIG. 4A
FIG. 4B

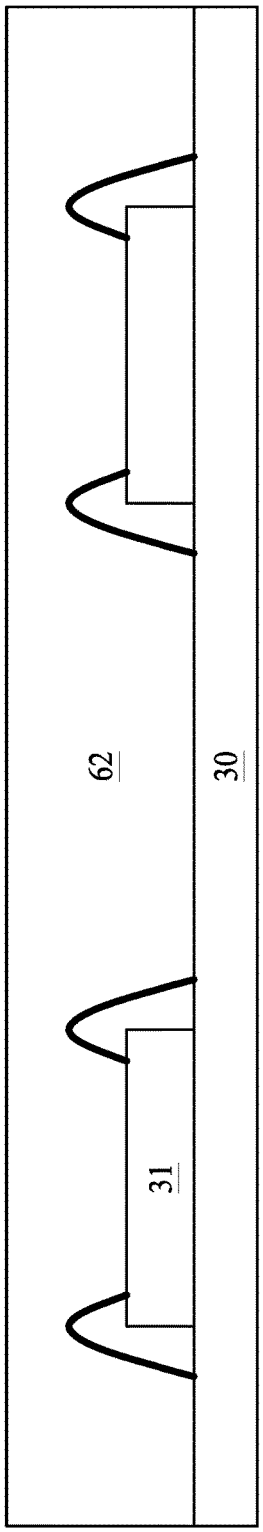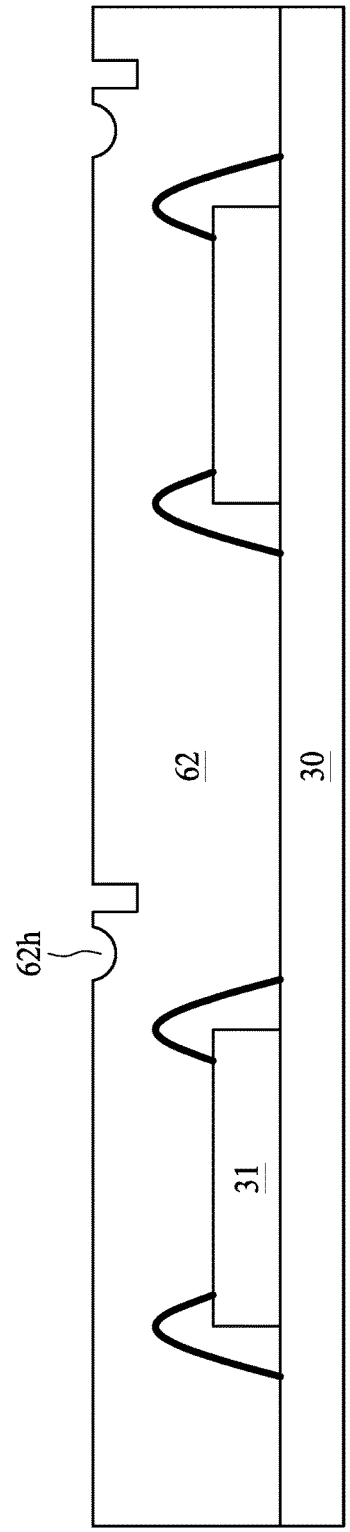
FIG. 6A
FIG. 6B

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly, to a semiconductor package device including an antenna and a method of manufacturing the same.

2. Description of the Related Art

Wireless communication devices, such as cell phones, typically include antennas for transmitting and receiving radio frequency (RF) signals. In a comparative approach, a wireless communication device includes an antenna and a communication module, each disposed on different parts of a circuit board. Under the comparative approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. In addition, in some types of antenna (e.g., metal stamping antenna), a shape of an antenna is prone to being distorted because the antenna is not firm enough to bear the pressure during the formation of a molding compound.

SUMMARY

In accordance with some embodiments of the present disclosure, a semiconductor package device comprises a substrate, a die, an encapsulant and an antenna layer. The substrate has a top surface and a bottom surface opposite to the top surface. The die is disposed on the top surface of the substrate. The encapsulant is disposed on the top surface of the substrate and surrounds the die. The encapsulant has a top surface and defines a recess on the top surface of the encapsulant. The antenna layer is disposed on the top surface of the encapsulant and extends within the recess on the top surface of the encapsulant.

In accordance with some embodiments of the present disclosure, a semiconductor package device comprises a substrate, a die, a package body and an antenna layer. The substrate has a top surface and a bottom surface opposite to the top surface. The die is disposed on the top surface of the substrate. The package body is disposed on the top surface of the substrate and surrounds the die. The antenna layer is disposed on a top surface of the package body, wherein the antenna layer defines a recess.

In accordance with some embodiments of the present disclosure, a method of manufacturing a semiconductor package device comprises: (a) providing a substrate strip; (b) disposing a die on the substrate strip; (c) forming a package body on the substrate strip to surround the die, (d) forming at least one recess on a top surface of the package body; (e) cutting through the package body and the substrate strip to separate the substrate strip into an individual substrate; and (f) forming an antenna layer on the package body and extending within the recess of the package body.

BRIEF DESCRIPTION OF THE DRAWINGS

FIG. 4A and FIG. 4B illustrate a semiconductor manufacturing method in accordance with some embodiments of the present disclosure.

FIG. 6A, FIG. 6B, FIG. 6C, FIG. 6D and FIG. 6E illustrate a semiconductor manufacturing method in accordance with some embodiments of the present disclosure.

Figure 1A:
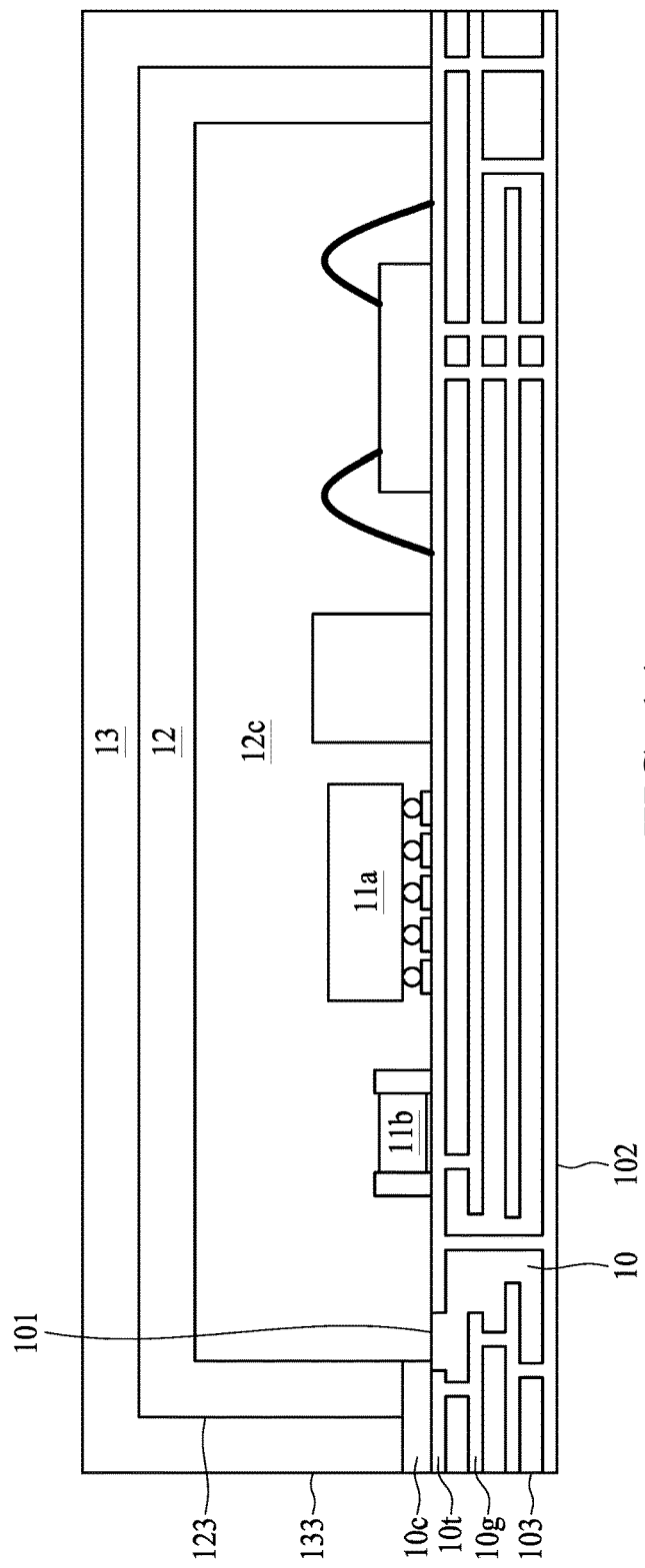
FIG. 1A illustrates a cross-sectional view of a semiconductor package device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

FIG. 1A illustrates a cross-sectional view of a semiconductor package device 1A in accordance with some embodiments of the present disclosure. The semiconductor package device 1A includes a substrate 10, electronic components 11a, 11b, a package body 12 and a metal layer 13.

The substrate 10 may be, for example, a printed circuit board, such as a paper-based copper foil laminate, a composite copper foil laminate, or a polymer-impregnated glass-fiber-based copper foil laminate. The substrate 10 may include opposite surfaces 101, 102 and a lateral surface 103 extending between the surfaces 101, 102. In some embodiments, the surface 101 of the substrate 10 is referred to as a top surface or a first surface and the surface 102 of the substrate 10 is referred to as a bottom surface or a second surface. The substrate 10 may include an interconnection structure (e.g., an electrical connection), such as a redistribution layer (RDL) 10t or a grounding element 10g (or grounding segment).

The electronic components 11a, 11b are disposed on the top surface 101 of the substrate 10. The electronic component 11a may be an active component, such as an integrated circuit (IC) chip or a die. The electronic component 11b may be a passive component, such as a capacitor, a resistor or an inductor. Each electronic component 11a, 11b may be electrically connected to one or more of another electronic component 11a, 11b and to the substrate 10 (e.g., to the RDL 10*t*), and electrical connection may be attained by way of flip-chip or wire-bond techniques.

The package body 12 (or encapsulant) is disposed on the top surface 101 of the substrate 10. The package body 12 has or defines a cavity 12*c* to accommodate the electronic components 11*a*, 11*b*. For example, the package body 12 defines an air gap between the electronic components 11*a*, 11*b* and the package body 12. In some embodiments, a lateral surface 123 of the package body 12 is not aligned or coplanar with the lateral surface 103 of the substrate 10. That is, a distance is formed between the lateral surface 123 of the package body 12 and the lateral surface 103 of the substrate 10, and the lateral surface 123 of the package body 12 is inwardly recessed from the lateral surface 103 of the substrate 10. In some embodiments, the lateral surface 123 of the package body 12 is substantially perpendicular to a top surface of the package body 12. In some embodiments, the package body 12 includes an epoxy resin including fillers, a molding compound (e.g., an epoxy molding compound or other molding compound), a polyimide, a phenolic compound or material, a material with a silicone dispersed therein, or a combination of two or more thereof.

The metal layer 13 is disposed on the top surface 101 of the substrate 10 and exterior surfaces of the package body 12. The metal layer 13 is disposed on an electrical contact 10*c* (e.g., conductive pad) on the top surface 101 of the substrate 10. In some embodiments, if the metal layer 13 functions as an antenna, the metal layer 13 (or antenna layer) is electrically connected to the electronic component 11*a* or 11*b* through the RDL 10*t* within the substrate 10. A portion of the metal layer 13 connected with the electrical contact 10*c* on the substrate 10 defines a feeding line portion of the metal layer 13. In other embodiments, if the metal layer 13 functions as a shielding layer, the metal layer 13 is electrically connected to the grounding element 10*g* within the substrate 10. In some embodiments, a lateral surface 133 of the metal layer 13 is substantially coplanar with the lateral surface 103 of the substrate 10. The metal layer 13 includes a conductive material such as a metal or a metal alloy. Examples of the conductive material include gold (Au), sliver (Ag), aluminum (Al), copper (Cu), or an alloy of two or more thereof.

In a comparative semiconductor package device integrated with an antenna, the antenna and electronic components are disposed on a substrate side by side, which would increase a total area (e.g., X-Y dimensions) of the semiconductor package device. In accordance with some embodiments as shown in FIG. 1A, the metal layer 13 is formed or disposed on the package body 12, and thus a total area of the semiconductor package device 1A can be reduced. In addition, the metal layer 13 directly contacts the electrical contact 10*c* on the substrate 10, which would reduce a signal loss and improve the performance of the semiconductor package device 1A.

Figure 1B:
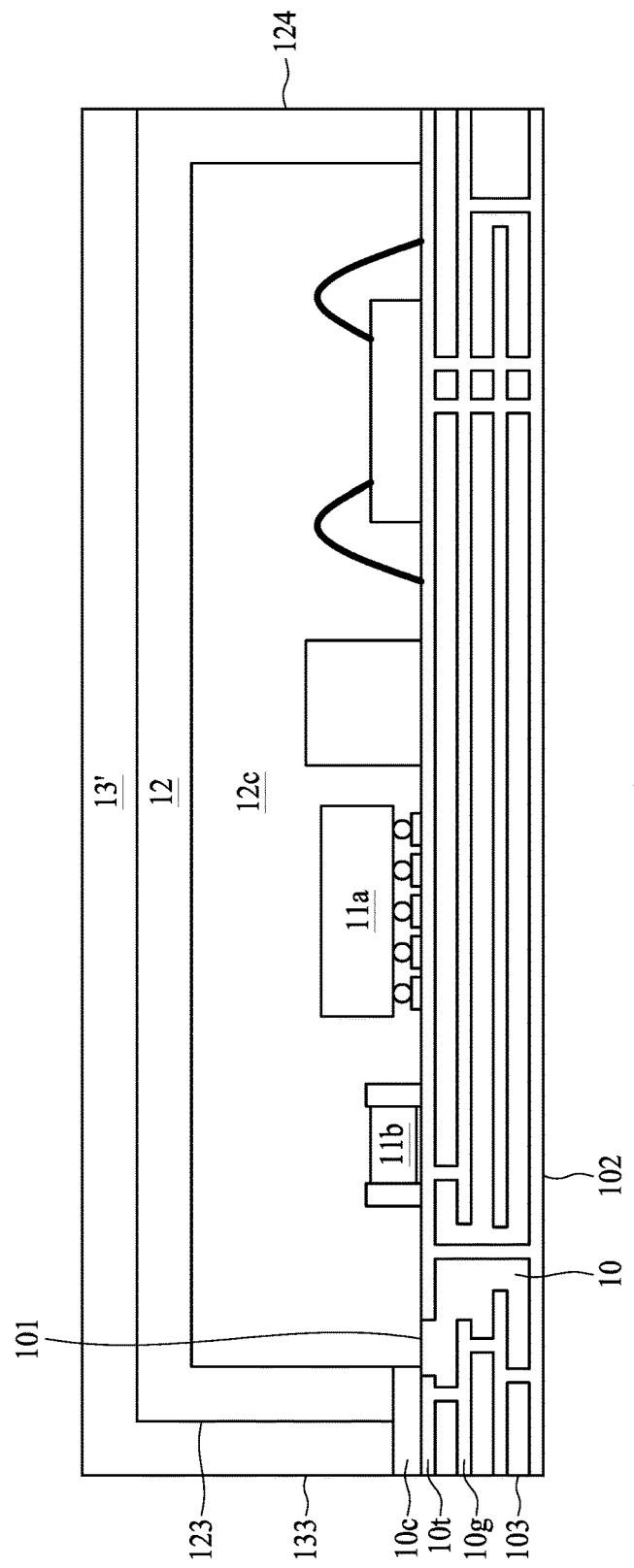
FIG. 1B illustrates a cross-sectional view of a semiconductor package device in accordance with some embodiments of the present disclosure.

FIG. 1B illustrates a cross-sectional view of a semiconductor package device 1B in accordance with some embodiments of the present disclosure. The semiconductor package device 1B is similar to the semiconductor package device 1A shown in FIG. 1A except that an antenna 13' of the semiconductor package device 1B is not disposed on all lateral surfaces of the package body 12. For example, at least one lateral surface (e.g., a lateral surface 124) is exposed from the metal layer 13'.

Figure 2A:
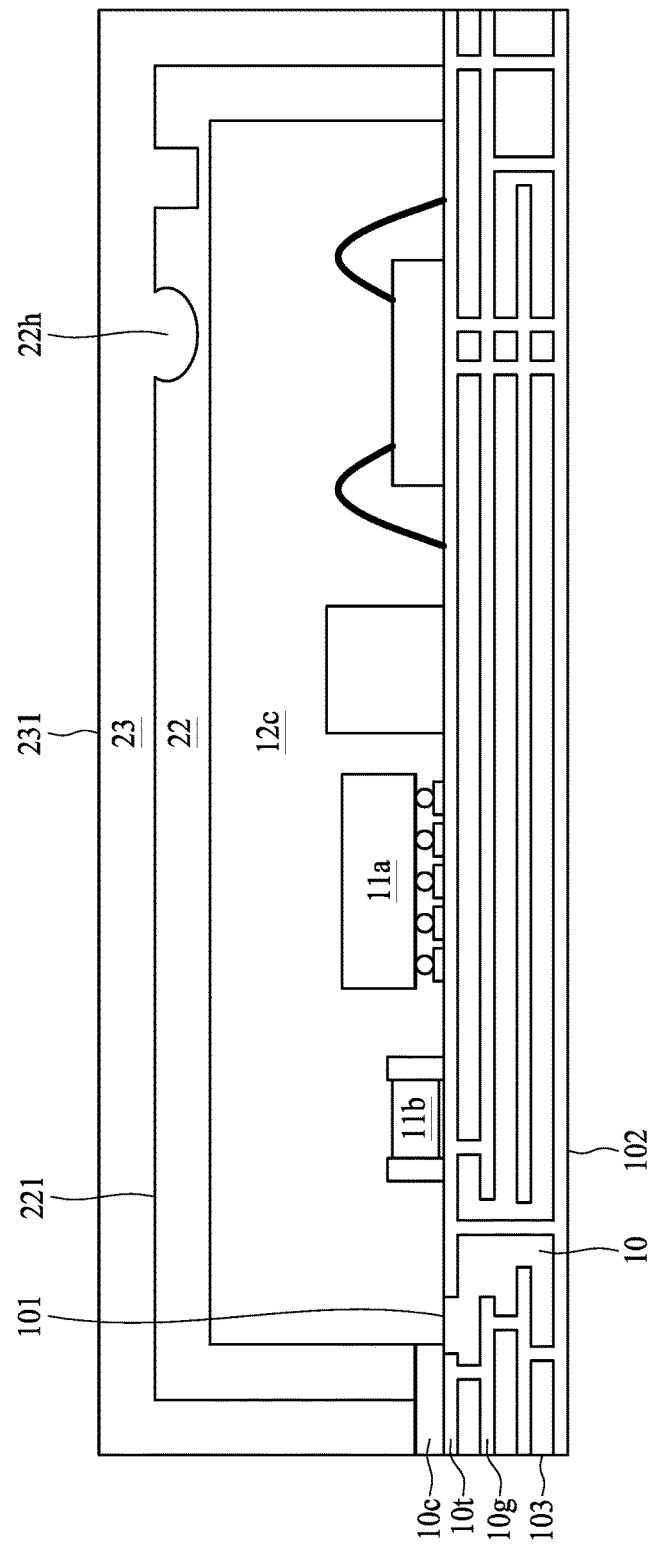
FIG. 2A illustrates a cross-sectional view of a semiconductor package device in accordance with some embodiments of the present disclosure.

FIG. 2A illustrates a cross-sectional view of a semiconductor package device 2A in accordance with some embodiments of the present disclosure. The semiconductor package device 2A is similar to the semiconductor package device 1A shown in FIG. 1A except that a package body 22 of the semiconductor package device 2A has or defines at least one recess 22*h* (or aperture). The recess 22*h* is formed on a top surface 221 of the package body 22 without penetrating the package body 22. That is, a depth of the recess 22*h* is less than a thickness of the package body 22 at the top surface 221 of the package body 22; for example, the depth of the recess 22*h* may be a non-zero value of up to about 90%, up to about 80%, up to about 70%, up to about 60%, or up to about 50% of the thickness of the package body 22. The shape and the number of recesses 22*h* can be selected or determined based on different design specifications. In some embodiments, the recess 22*h* is shaped as a cylinder, a cube or a cone. The metal layer 23 is disposed on exterior surfaces of the package body 22 and extends within the recess 22*h* of the package body 22, so as to fill the recess 22*h*.

Figure 2B:
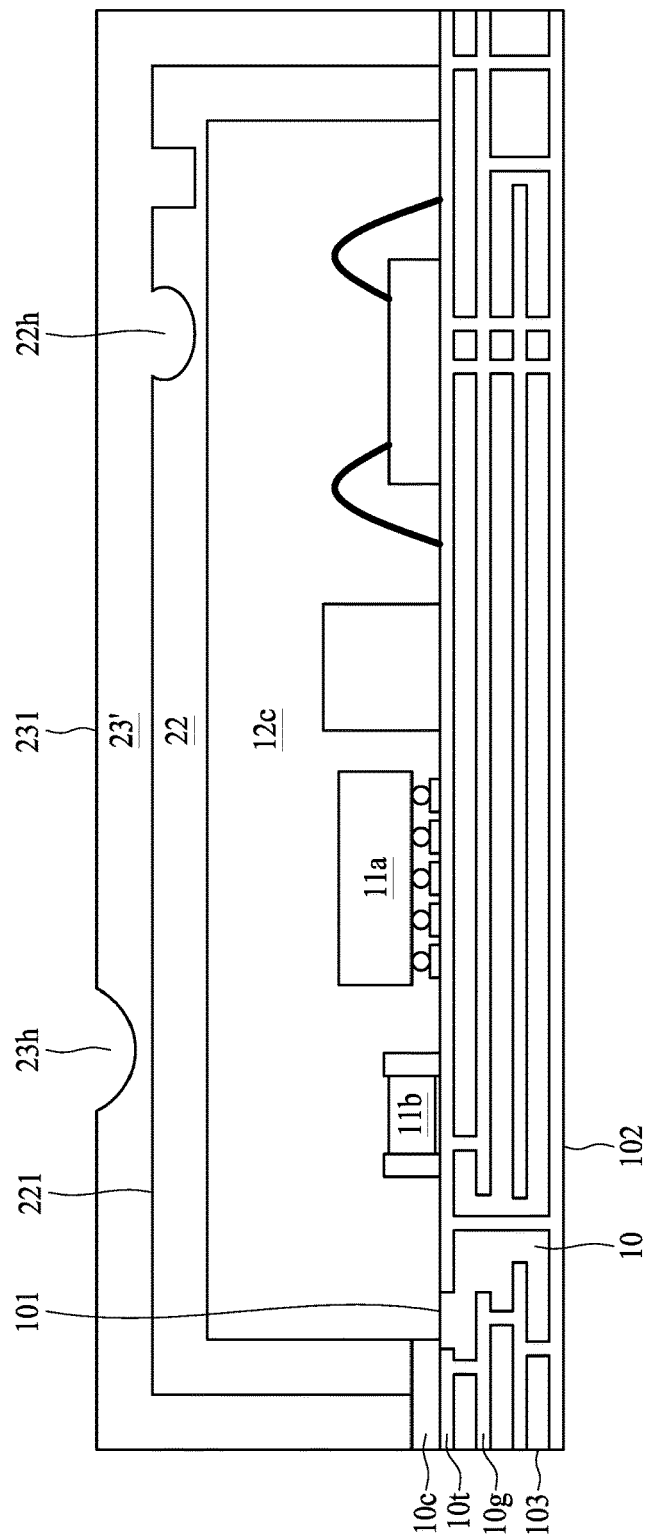
FIG. 2B illustrates a cross-sectional view of a semiconductor package device in accordance with some embodiments of the present disclosure.

FIG. 2B illustrates a cross-sectional view of a semiconductor package device 2B in accordance with some embodiments of the present disclosure. The semiconductor package device 2B is similar to the semiconductor package device 2A shown in FIG. 2A except that a metal layer 23' of the semiconductor package device 2B has or defines at least one recess 23*h* (or aperture). The recess 23*h* is formed on a top surface 231 of the metal layer 23' without penetrating the metal layer 23'. That is, a depth of the recess 23*h* is less than a thickness of the metal layer 23' at the top surface 231 of the metal layer 23'; for example, the depth of the recess 23*h* may be a non-zero value of up to about 90%, up to about 80%, up to about 70%, up to about 60%, or up to about 50% of the thickness of the metal layer 23'. The shape and the number of recesses 23*h* can be selected or determined based on different design specifications. In some embodiments, the recess 23*h* is shaped as a cylinder, a cube or a cone.

Figure 2C:
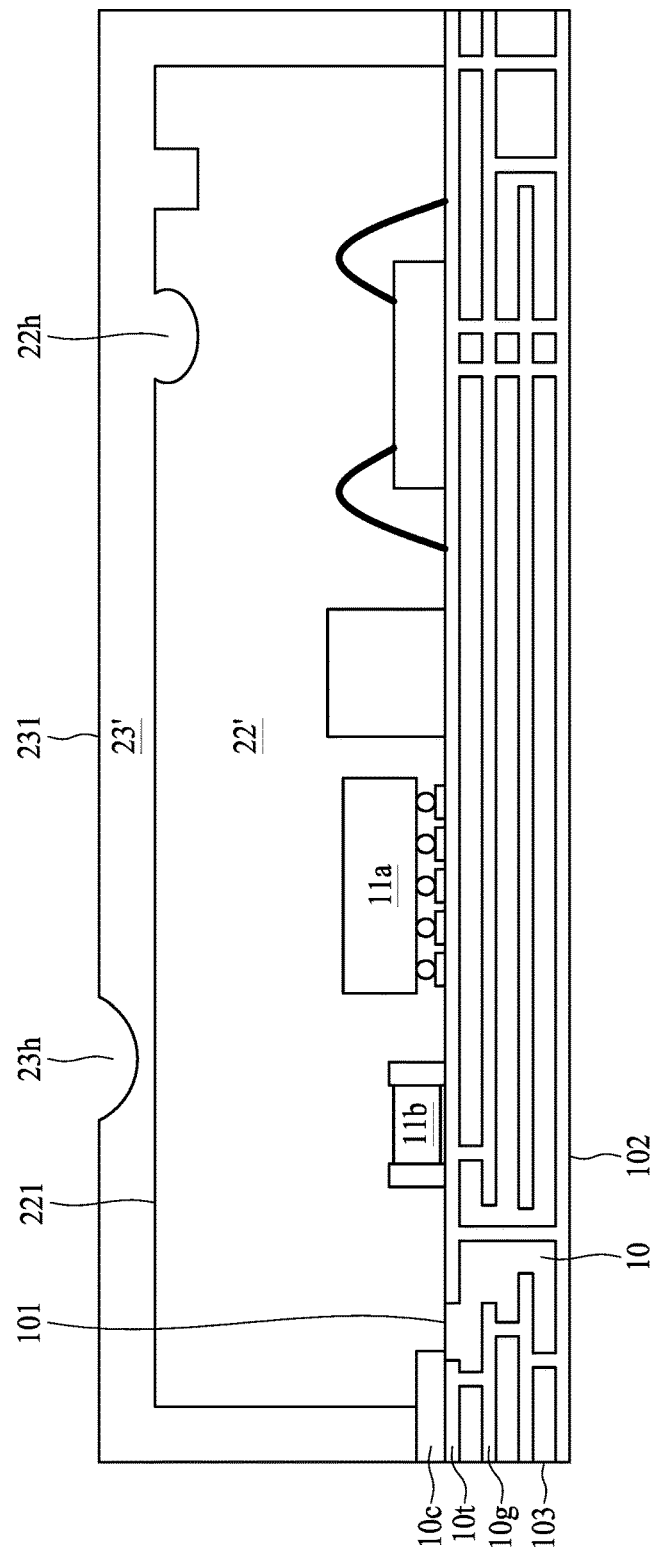
FIG. 2C illustrates a cross-sectional view of a semiconductor package device in accordance with some embodiments of the present disclosure.

FIG. 2C illustrates a cross-sectional view of a semiconductor package device 2C in accordance with some embodiments of the present disclosure. The semiconductor package device 2C is similar to the semiconductor package device 2B shown in FIG. 2B except that a package body 22' of the semiconductor package device 2C substantially fully covers or encapsulates the electronic components 11*a*, 11*b*. For example, there is no air gap or cavity between the package body 22' and the electronic components 11*a*, 11*b*, and the package body 22' is in contact with the electronic components 11*a*, 11*b*.

Figure 2D:
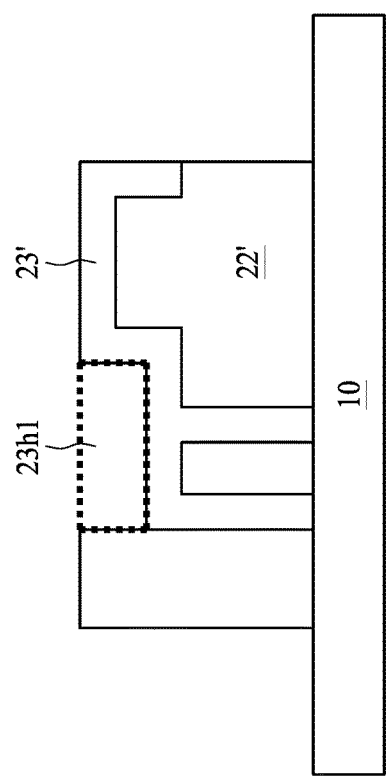
FIG. 2D illustrates a side view of a semiconductor package device in accordance with some embodiments of the present disclosure.
Figure 2E:
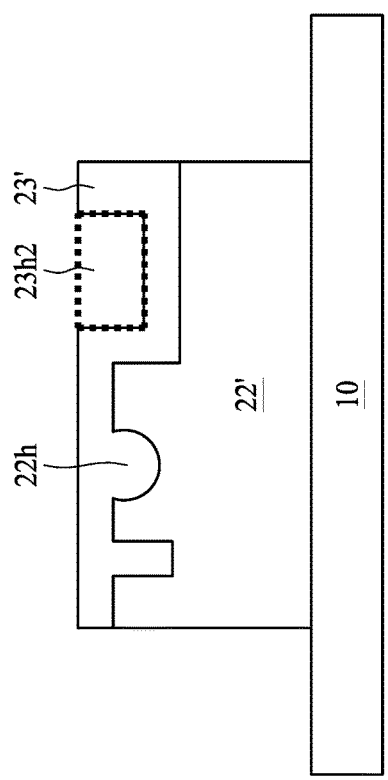
FIG. 2E illustrates a side view of a semiconductor package device in accordance with some embodiments of the present disclosure.
Figure 2F:
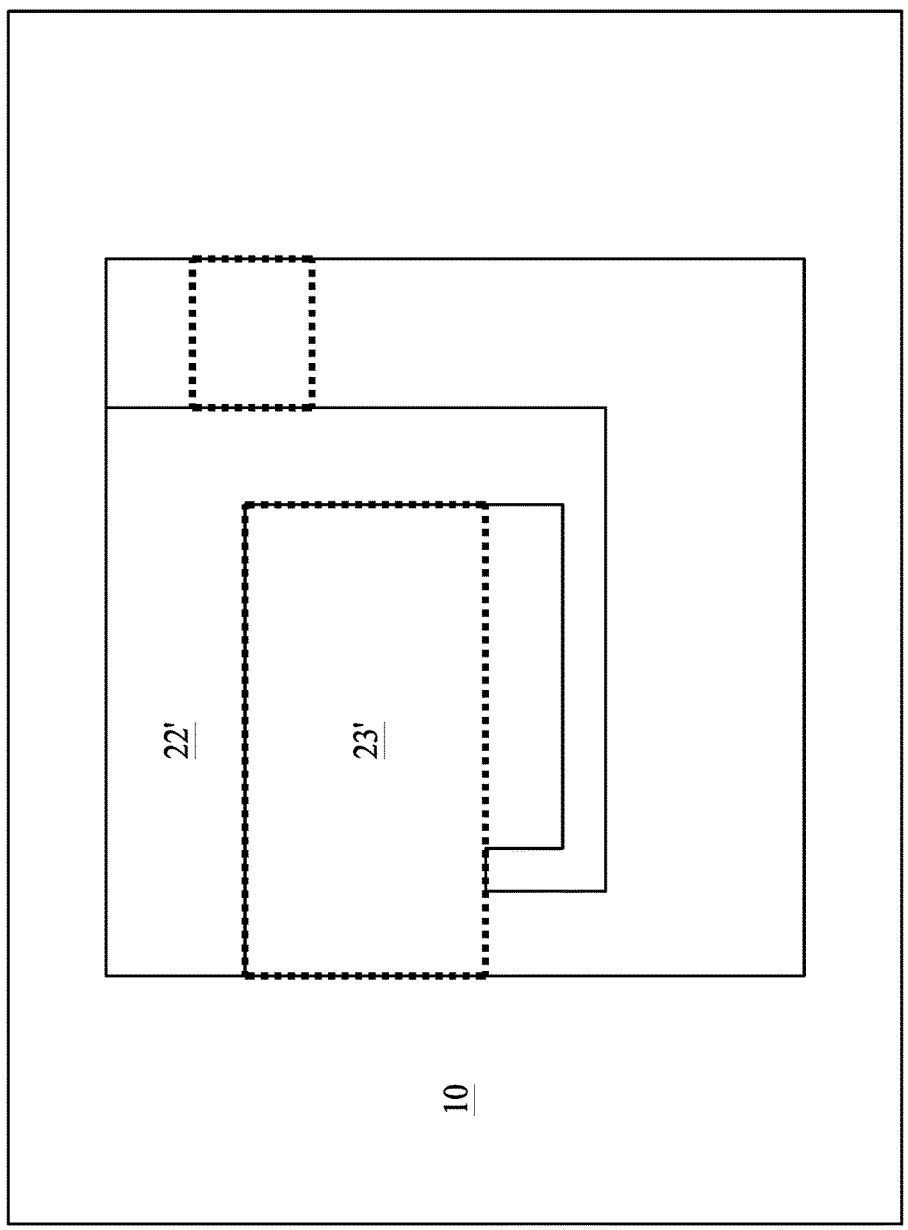
FIG. 2F illustrates a top view of a semiconductor package device in accordance with some embodiments of the present disclosure.

As shown in FIG. 2A, FIG. 2B and FIG. 2C, by forming the recess 22*h* on the package body 22 or 22' and extending the metal layer 23 or 23' into the recess 22*h*, a three-dimensional antenna can be achieved at a relatively less expensive and more streamlined way. In some embodiments, as shown in FIG. 2D, FIG. 2E and FIG. 2F, which respectively show a side view from one side of the semiconductor package device 2C, a side view from another side of the semiconductor package device 2C and a top view of the semiconductor package device 2C, the shape and the location of the recess 23*h* of the metal layer 23' relative to the location of the recess 22*h* of the package body 22' can be used to achieve impedance matching. For example, the recess 23*h* may be laterally spaced apart from the recess 22*h*.

FIG. 3A, FIG. 3B, FIG. 3C and FIG. 3D illustrate a semiconductor manufacturing method in accordance with some embodiments of the present disclosure.

Figure 3A:
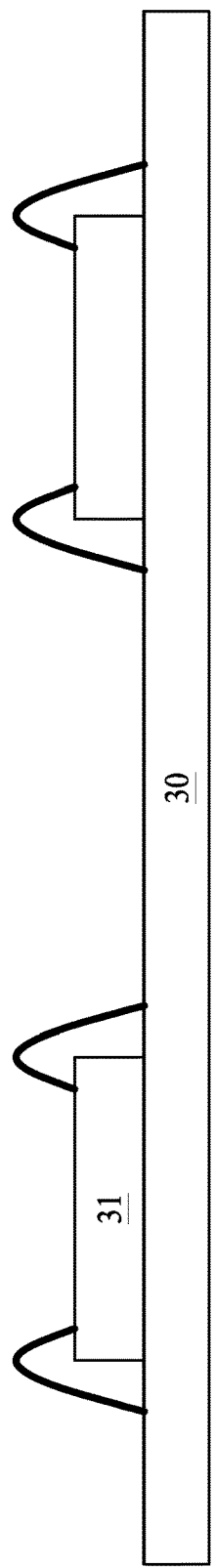
FIG. 3A, FIG. 3B, FIG. 3C and FIG. 3D illustrate a semiconductor manufacturing method in accordance with some embodiments of the present disclosure.

Referring to FIG. 3A, a strip of substrates including multiple substrates 30 is provided, and the provision of the multiple substrates 30 allows multiple semiconductor package devices to be manufactured concurrently. The substrate 30 may be, for example, a printed circuit board, such as a paper-based copper foil laminate, a composite copper foil laminate, or a polymer-impregnated glass-fiber-based copper foil laminate. The substrate 30 may include an interconnection structure, such as an RDL or a grounding element. In some embodiments, the substrate 30 is the same as, or similar to, the substrate 10 shown in FIG. 1A.

At least one electronic component 31 is formed or disposed on each substrate 30. The electronic component 31 may be an active electronic component, such as an IC or a die, or a passive electronic component, such as a capacitor, a resistor or an inductor. The electronic component 31 may be electrically connected to the substrate 30 (e.g., to the RDL) by way of flip-chip or wire-bond techniques.

Figure 3B:
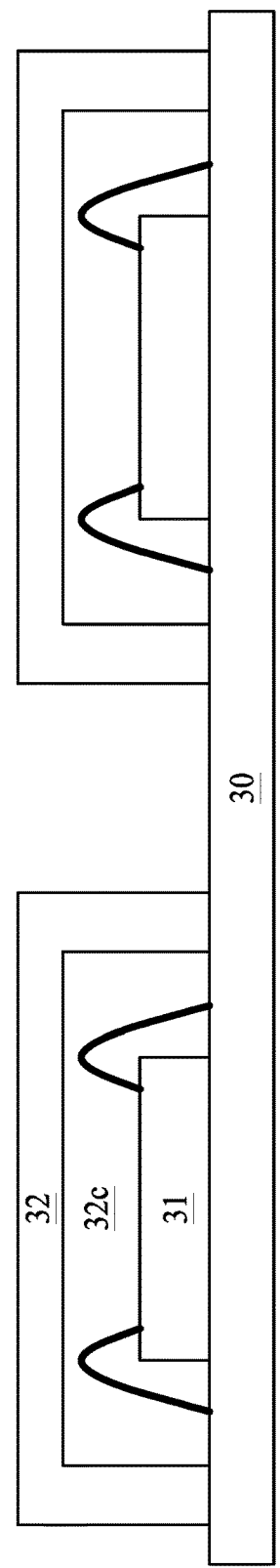

Referring to FIG. 3B, a package body 32 is formed on each substrate 31. The package body 32 has or defines a cavity 32c to accommodate the electronic component 31. For example, the package body 32 defines an air gap between the electronic component 31 and the package body 32. In some embodiments, the package body 32 includes an epoxy resin including fillers, a molding compound (e.g., an epoxy molding compound or other molding compound), a polyimide, a phenolic compound or material, a material with a silicone dispersed therein, or a combination of two or more thereof. The package body 32 may be formed by a molding technique, such as transfer molding or compression molding, or a stamping technique.

Figure 3C:
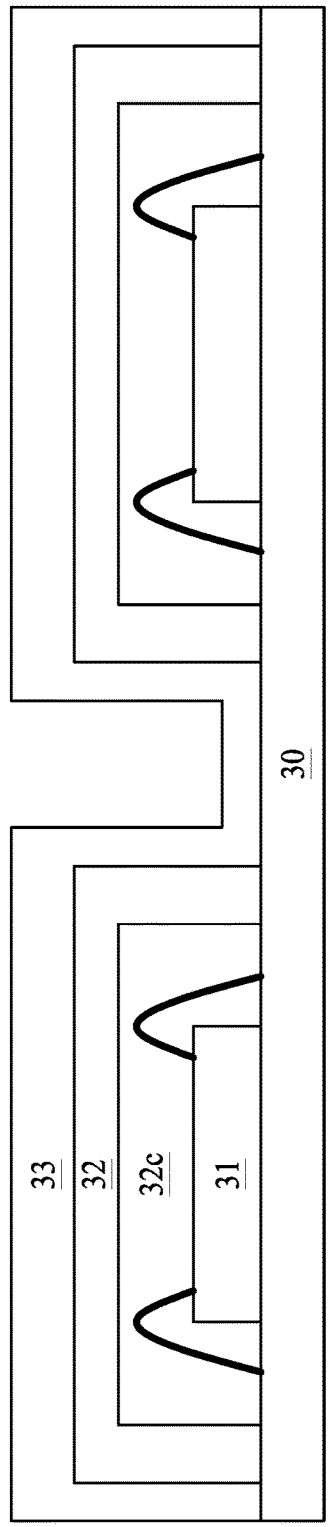

Referring to FIG. 3C, a metal layer 33 is disposed or formed on the substrate 30 and exterior surfaces of the package body 32. The metal layer 33 includes a conductive material such as a metal or a metal alloy. Examples of the conductive material include Au, Ag, Al, Cu or an alloy of two or more thereof. In some embodiments, the metal layer 33 can be formed by sputtering or other suitable deposition processes. In some embodiments, the metal layer 33 can be formed by forming an antenna pattern (e.g., a patterned photoresist layer) on the package body 32, and forming the metal layer 33 according to the antenna pattern.

Figure 3D:
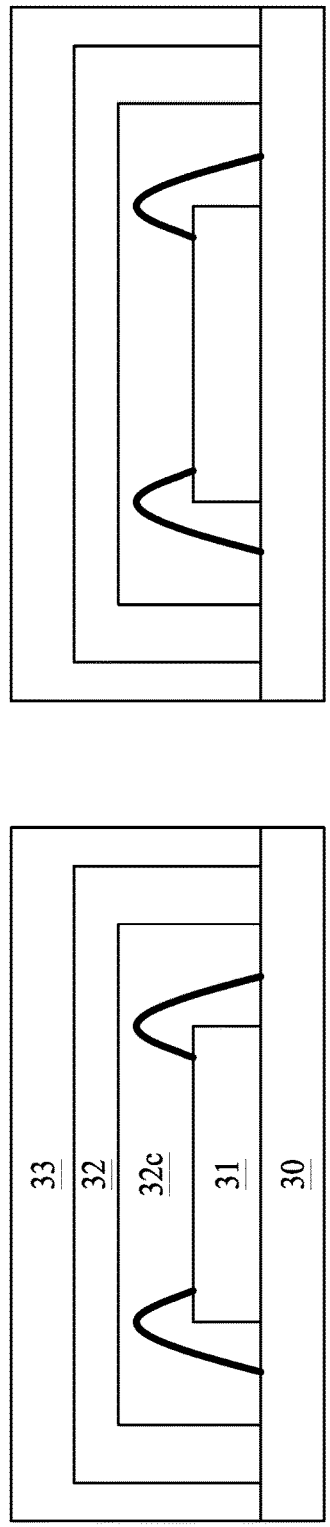

Referring to FIG. 3D, singulation may be performed to separate out individual semiconductor package devices. That is, the singulation is performed through the metal layer 33, the package body 32 and the substrate strip including the substrates 30. The singulation may be performed, for example, by using a dicing saw, laser or other appropriate cutting technique. In some embodiments, a resulting semiconductor package device shown in FIG. 3D is similar to the semiconductor package device 1A shown in FIG. 1A.

FIG. 4A and FIG. 4B illustrate a semiconductor manufacturing method in accordance with some embodiments of the present disclosure. The operation shown in FIG. 4A is subsequent to the operations shown in FIG. 3A.

Referring to FIG. 4A, a cover 44 (or lid) is formed. The cover 44 includes a package body 42 (or plastic lid) and a metal layer 43 covering the package body 42. In some embodiments, the cover 44 may be formed by a laser direct structuring (LDS) technique.

Referring to FIG. 4B, the cover 44 is placed on each substrate 30 to cover the electronic component 31. The cover 44 has or defines a cavity to accommodate the electronic component 31. For example, the cover 44 defines an air gap between the electronic component 31 and the cover 44. Then, singulation may be performed to separate out individual semiconductor package devices as shown in FIG. 3D.

Figure 5A:
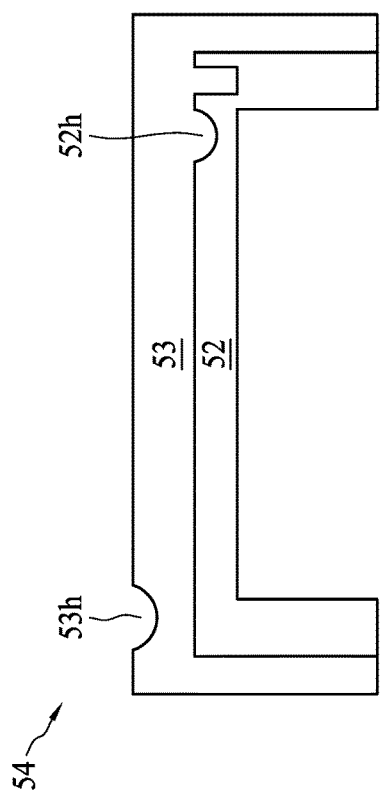
FIG. 5A and FIG. 5B illustrate a semiconductor manufacturing method in accordance with some embodiments of the present disclosure.
Figure 5B:
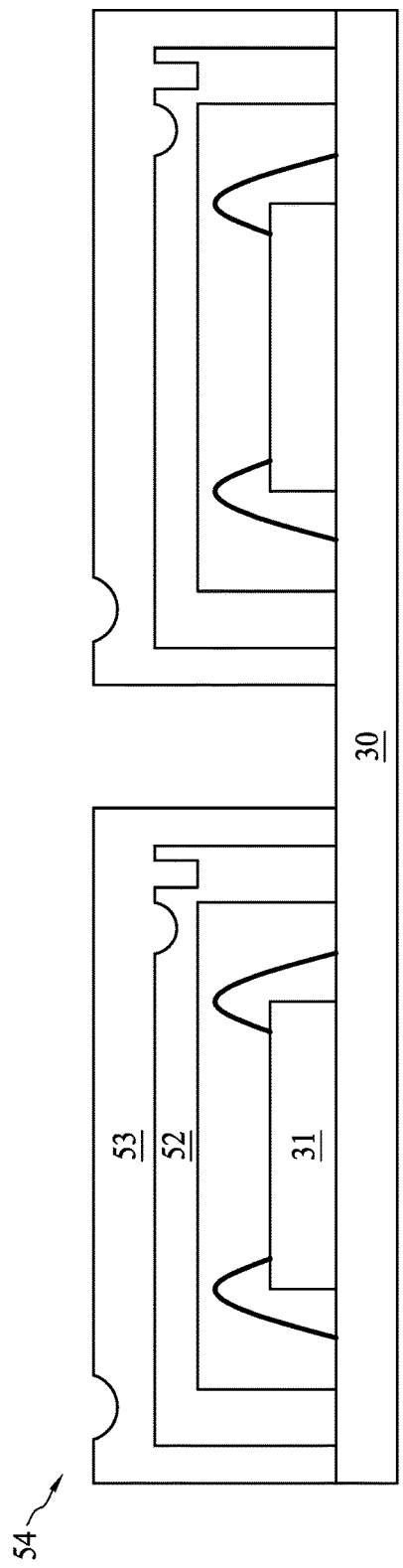

FIG. 5A and FIG. 5B illustrate a semiconductor manufacturing method in accordance with some embodiments of the present disclosure. The operation shown in FIG. 5A is subsequent to the operations shown in FIG. 3A. The operations shown in FIG. 5A and FIG. 5B are similar to those shown in FIG. 4A and FIG. 4B, except that in FIG. 5A, at least one recess 52h is formed in a package body 52 (or plastic lid) and at least one recess 53h is formed in a metal layer 53. In some embodiments, the recesses 52h and 53h can be formed by laser drilling, punching, etching or other suitable processes.

Referring to FIG. 5B, a cover 54 formed in FIG. 5A is placed on each substrate 30 to cover the electronic component 31. The cover 54 has or defines a cavity to accommodate the electronic component 31. For example, the cover 44 defines an air gap between the electronic component 31 and the cover 54. Then, singulation may be performed to separate out individual semiconductor package devices as shown in FIG. 3D. In some embodiments, a resulting separated semiconductor package device is similar to the semiconductor package device 2B shown in FIG. 2B.

FIG. 6A, FIG. 6B, FIG. 6C, FIG. 6D and FIG. 6E illustrate a semiconductor manufacturing method in accordance with some embodiments of the present disclosure.

Referring to FIG. 6A, a strip of substrates including multiple substrates 30 is provided, and the provision of the multiple substrates 30 allows multiple semiconductor package devices to be manufactured concurrently. The substrate 30 may be, for example, a printed circuit board, such as a paper-based copper foil laminate, a composite copper foil laminate, or a polymer-impregnated glass-fiber-based copper foil laminate. The substrate 30 may include an interconnection structure, such as an RDL or a grounding element. In some embodiments, the substrate 30 is the same as, or similar to, the substrate 10 shown in FIG. 1A.

At least one electronic component 31 is formed or disposed on each substrate 30. The electronic component 31 may be an active electronic component, such as an IC or a die, or a passive electronic component, such as a capacitor, a resistor or an inductor. The electronic component 31 may be electrically connected to the substrate 30 (e.g., to the RDL) by way of flip-chip or wire-bond techniques.

A package body 62 is formed on the strip of the substrates 30 to cover or encapsulate each electronic component 31. In some embodiments, the package body 62 includes an epoxy resin including fillers, a molding compound (e.g., an epoxy molding compound or other molding compound), a polyimide, a phenolic compound or material, a material with a silicone dispersed therein, or a combination of two or more thereof. The package body 62 may be formed by a molding technique, such as transfer molding or compression molding.

Referring to FIG. 6B, multiple recesses 62h are formed in the package body 62. In some embodiments, the recesses 62h can be formed by, for example, laser grooving, punching, etching, routing or other suitable processes.

Figure 6C:
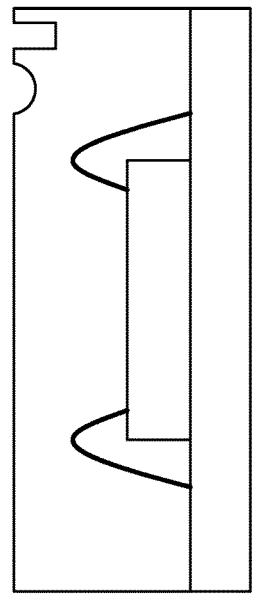

Referring to FIG. 6C, singulation may be performed to separate out individual semiconductor package devices. That is, the singulation is performed through the package body 62 and the substrate strip including the substrates 30. The singulation may be performed, for example, by using a dicing saw, laser or other appropriate cutting technique.

Figure 6D:
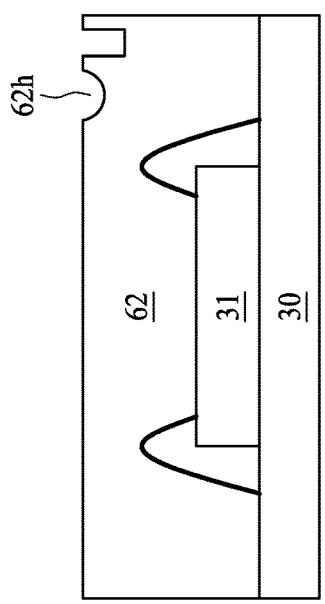
Figure 6D:
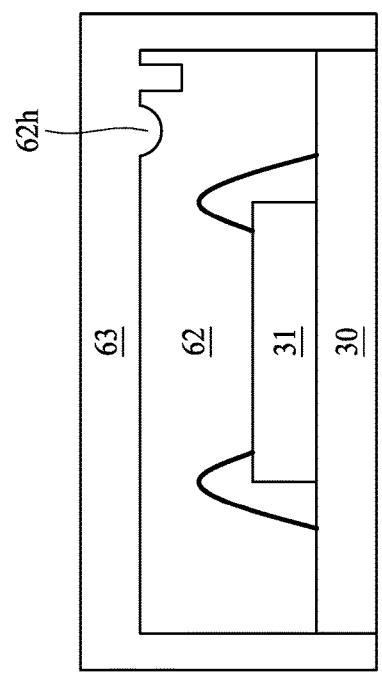

Referring to FIG. 6D, a metal layer 63 is disposed or formed on lateral surfaces of the substrate 30 and exterior surfaces (including a top surface and lateral surfaces) of the package body 62. The metal layer 63 extends into the recesses 62h of the package body 62. The metal layer 63 includes a conductive material such as a metal or a metal alloy. Examples of the conductive material include Au, Ag, Al, Cu or an alloy of two or more thereof. In some embodiments, the metal layer 63 can be formed by sputtering or other suitable deposition processes.

Figure 6E:
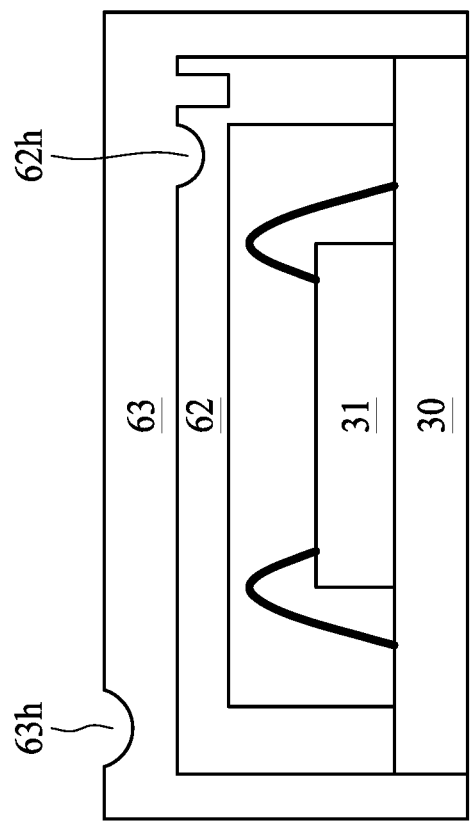

Referring to FIG. 6E, at least one recess 63h is formed in the metal layer 63 to form a semiconductor package device 6. In some embodiments, the semiconductor package device 6 is similar to the semiconductor package device 2C shown in FIG. 2C, except that the metal layer 63 covers the lateral surfaces of the substrate 30, and a bottom end of the metal layer 63 is substantially coplanar with a bottom surface of the substrate 30. In some embodiments, the recesses 63h can be formed by, for example, laser grooving, punching, etching, routing or other suitable processes.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. Two surfaces or components can be deemed to be "substantially parallel" if an angle therebetween is, for example, 0°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising
a substrate having a top surface and a bottom surface opposite to the top surface;
a die disposed on the top surface of the substrate;
a package body disposed on the top surface of the substrate and surrounding the die; and
an antenna layer disposed on a top surface of the package body, wherein the antenna layer defines a first recess, wherein
the package body defines a second recess on the top surface of the package body, and
the second recess is laterally spaced apart from the first recess.

2. The semiconductor package device of claim 1, wherein the substrate includes a conductive pad on the top surface of the substrate, and the antenna layer contacts the conductive pad on the top surface of the substrate.

3. The semiconductor package device of claim 1, wherein a depth of the first recess defined by the antenna layer is less than a thickness of the antenna layer.

4. The semiconductor package device of claim 1, wherein the package body and the substrate define a space to accommodate the die.

5. The semiconductor package device of claim 1, wherein the package body contacts the die.

6. The semiconductor package device of claim 1, wherein the second recess of the package body is filled with the antenna layer.

7. The semiconductor package device of claim 6, wherein a depth of the second recess defined by the package body is less than a thickness of the package body.

8. The semiconductor package device of claim 1, wherein
the substrate has a lateral surface extending between the top surface and the bottom surface of the substrate;
the package body has a lateral surface substantially perpendicular to the top surface of the package body; and
the lateral surface of the substrate is not aligned with the lateral surface of the package body.

9. The semiconductor package device of claim 8, wherein
the antenna layer has a top surface disposed on the top surface of the package body, and a lateral surface disposed on the lateral surface of the package body; and
the lateral surface of the antenna layer is substantially coplanar with the lateral surface of the substrate.

10. The semiconductor package device of claim 8, wherein the second recess defined by the package body is filled with the antenna layer.

11. A semiconductor package device, comprising
a substrate having a top surface and a bottom surface opposite to the top surface;

a die disposed on the top surface of the substrate;

an encapsulant disposed on the top surface of the substrate and surrounding the die, the encapsulant having a top surface and defining a first recess on the top surface of the encapsulant; and an antenna layer disposed on the top surface of the encapsulant and extending within the first recess on the top surface of the encapsulant, wherein a portion of the antenna layer that is directly above the first recess is substantially planar, and wherein the substrate includes a conductive pad on the top surface of the substrate, and the antenna layer contacts the conductive pad on the top surface of the substrate.

12. The semiconductor package device of claim 1, wherein a depth of the first recess defined by the encapsulant is less than a thickness of the encapsulant.

13. The semiconductor package device of claim 1, wherein the first recess defined by the encapsulant is filled with the antenna layer.

14. The semiconductor package device of claim 11, wherein the encapsulant defines a space between the encapsulant and the die.

15. The semiconductor package device of claim 11, wherein the antenna layer is electrically connected to the die.

16. The semiconductor package device of claim 11, wherein the encapsulant contacts the die.

17. The semiconductor package device of claim 11, wherein the substrate has a lateral surface extending between the top surface and the bottom surface of the substrate;

the encapsulant has a lateral surface substantially perpendicular to the top surface of the encapsulant; and the lateral surface of the substrate is not aligned with the lateral surface of the encapsulant.

18. The semiconductor package device of claim 17, wherein the antenna layer has a top surface disposed on the top surface of the encapsulant, and a lateral surface disposed on the lateral surface of the encapsulant; and the lateral surface of the antenna layer is substantially coplanar with the lateral surface of the substrate.

19. The semiconductor package device of claim 11, wherein the antenna layer has a top surface disposed on the top surface of the encapsulant, and the antenna layer defines a second recess on the top surface of the antenna layer.

20. The semiconductor package device of claim 19, wherein the second recess on the top surface of the antenna layer is laterally spaced apart from the first recess on the top surface of the encapsulant.

21. The semiconductor package device of claim 19, wherein a depth of the second recess defined by the antenna layer is less than a thickness of the antenna layer.

* * * * *